United States Patent [19]

Brahmbhatt

[11] Patent Number: 5,341,342

[45] Date of Patent: Aug. 23, 1994

[54] FLASH MEMORY CELL STRUCTURE

[75] Inventor: Dhaval J. Brahmbhatt, San Jose, Calif.

[73] Assignee: National Semiconductor Corporation, Santa Clara, Calif.

[21] Appl. No.: 992,838

[22] Filed: Dec. 18, 1992

[51] Int. Cl.⁵ .................... G11C 17/00; H01L 29/68
[52] U.S. Cl. ........................ 365/182; 365/185;
     365/900; 257/314; 257/316; 257/315
[58] Field of Search ............. 365/185, 900, 182;
     257/314, 315, 316, 317, 318, 319, 320, 326

[56] References Cited

U.S. PATENT DOCUMENTS

| 4,328,565 | 5/1982  | Harari          | 365/185 |
| 4,639,893 | 1/1987  | Eitan           | 365/185 |
| 4,698,787 | 10/1987 | Mukherjee et al.| 365/185 |
| 4,959,812 | 9/1990  | Momodomi et al. | 365/900 |

FOREIGN PATENT DOCUMENTS 0369676  5/1990  .

OTHER PUBLICATIONS

B. J. Woo et al. "A Novel Memory Cell Using Flash Array Contactless EPROM (Face) Technology", 1990 IEEE, pp. 5.1.1–5.1.3.
B. J. Woo et al. "A Poly-Buffered Face Technology For High Density Flash Memories" Article—pp. 73, 74 and 5.1.4.
Masao Kuriyama et al. "A 5V-Only 0.6μm Flash EEPROM with Row Decoder in Triple-Well Structure", 1990 IEEE, pp. 152–155, including pp. 270 & 271.

Primary Examiner—Viet Q. Nguyen
Attorney, Agent, or Firm—Limbach & Limbach

[57] ABSTRACT

A semiconductor flash memory cell which includes a P type substrate with an N type well formed therein followed by a P type well formed within the N well. An N type drain is formed in the P well as is an N type source, with the drain and source being spaced apart so as to create a channel region therebetween. A floating gate is disposed over only a part of the channel and a first segment of a control gate is disposed over the remainder of the channel. A second segment of the control gate is disposed over the floating gate. The arrangement of the floating and control gate functions to eliminate adverse effects of over erase. In addition, the well-within-a-well structure enables biasing voltages to be applied during erase which forces electrons removed from the floating gate to enter the channel region, rather than the drain region thereby increasing the program/erase cycle endurance of the cell.

5 Claims, 2 Drawing Sheets

FLASH MEMORY CELL STRUCTURE

BACKGROUND OF THE INVENTION

1. Field of the Invention

The present invention relate generally to semiconductor memory devices and in particular to a flash memory cell structure which having improved endurance to program/erase cycling.

2. Background Art

Flash semiconductor memories have recently been developed which are similar to conventional EPROMs in certain respects. However, unlike EPROMs which are programmed electrically and erased utilizing U.V. light, flash memories can be both electrically programmed and electrically erased.

Referring to the drawings, FIG. 1 depicts a conventional flash memory cell. The cell is formed in a P type substrate 10. An N+ source 12 and an N+ drain 14 are formed in the substrate 10. A channel region 16 is disposed in the substrate 10 intermediate the drain and source and adjacent the upper surface of the substrate.

A floating gate electrode 18, typically made of polysilicon, is disposed above the channel 16. A top or control gate 20, also typically made of polysilicon, is positioned above the channel 16 and the floating gate 20. A thin (about 100 Å) gate oxide 22 separates the channel 16 from the floating gate 22. The floating gate 18 and top gate 20 are separated by an interpoly dielectric layer 24.

Programming the flash cell is similar to that of an EPROM. The source 12 is grounded, as is the substrate 10. An intermediate voltage is applied to the drain 14 and a high voltage is applied to the top gate 20. The intermediate drain voltage generates "hot" electrons that are swept across the channel 16. The "hot" electrons create additional free electrons in the channel 16. The electrons are attracted to the high voltage applied to the top gate 20. Some electrons from the channel cross the thin gate oxide 22 and enter the floating gate 20 where they are trapped. The trapped electrons alter the theshold voltage of the device. This phenomenon is widely described in the literature as "hot electron injection".

Erasure, i.e., discharge of the floating gate 20, is accomplished by grounding the top gate 20 (together with the substrate 10). The drain 14 is permitted to float and a high voltage is applied to the source 12. The high voltage at the source 12 develops a high electric field across the gate oxide 22 so as to pull electrons off of the floating gate 18 by way of a mechanism known as Fowler-Nordheim tunneling.

One shortcoming of the flash cell structure of FIG. 1 is that it is possible during the erase step to "over erase" the cell so that there is a net positive charge left on the floating gate 18. This positive charge will have a tendency to invert the P type channel 16 so as to form a conductive channel similar to that present in a depletion mode transistor. This conductive channel causes a small amount of current to be drawn through the cell even when the cell is supposed to be non-selected. In a typical memory array, a large number of cells are connected in parallel so that a relatively large amount of total current will be drawn thereby interfering with proper operation of the memory during the "read" operations.

FIG. 2 shows another embodiment of a memory cell of the type disclosed in U.S. Pat. No. 4,328,565. The cell includes a P type substrate 10, having an N+ source 12 and an N+ drain formed therein. A channel, designated by the numeral 16, is located between the source 12 and drain 14. A polysilicon floating gate 18 is positioned over a segment 16A of the channel 16 and at least the edge of the drain region 14. The floating gate 18 is spaced apart from the source region 12.

The FIG. 2 embodiment includes a top gate, generally designated by the numeral 20, which is positioned over the channel 16. Top gate 20, which is made of polysilicon, includes one segment 20A which is positioned over the floating gate 18/channel section 16A and another segment 20B which is positioned over the other channel section 16B. A gate oxide 22 is disposed between the floating gate 18 and the channel section 16A and an interpoly dielectric 24 is disposed between the top gate segment 20A and the floating gate 22.

U.S. Pat. No. 4,328,565 states that the FIG. 2 cell can be erased using U.V. light. In the alternative, the patent states that the gate oxide 22 can be provided with a thin region (50 Å–150 Å) so that a strong electric field can be applied across the oxide to induce Fowler-Nordheim tunneling.

Should the FIG. 2 cell structure be over erased as described in connection with the FIG. 1 embodiment, there will be a tendency to leave a net positive charge on the floating gate 18. As is the case with the FIG. 1 embodiment, this will have a tendency to induce a conduction path in channel 16 similar to that of a depletion mode transistor. However, the conduction path will be formed only in channel section 16A under the floating gate 22 and not in channel section 16B which is not affected by the charge on the floating gate. Since the two channel sections 16A and 16B are in series, there will be no leakage through channel 16 since section 16B cannot be converted to depletion mode.

Erasure of the FIG. 2 cell utilizing the Fowler-Nordheim tunneling mechanism can be accomplished by applying a negative voltage to the top gate 20 while grounding the source 12 (and the substrate 10). The drain 14 is left open so that Fowler-Nordheim tunneling through the gate oxide will take place.

It has been observed that above-described method of erasing the FIG. 2 cell structure can result in low program/erase cycle endurance. The drain 14 and substrate 10 are both maintained at zero volts so that it is possible that charges generated during both program and erase will be produced at the same point in the drain region. It is not possible to "erase" by applying a positive voltage to source region 12 since the source is spaced away from the floating gate 18.

It is known that it would be preferable to cause the injection of positive carriers during erase to take place over the full length of the channel 16 rather than the drain 14. However, this cannot be guaranteed since the drain and channel regions are maintained at the same voltage relative to the top gate voltage. Thus, it is possible that a significant number of carriers will be provided by the drain thereby reducing the program/erase cycle endurance of the device.

The present invention overcomes the above-noted shortcomings of the prior art memory cells. The advantages of the FIG. 2 cell are obtained, yet improved program/erase cycle endurance is achieved. These and other advantages of the subject invention will become apparent to those skilled in the art upon a reading of the following detailed description of the invention together with the drawings.

SUMMARY OF THE INVENTION

A semiconductor flash memory is disclosed having a semiconductor body of a first conductivity type, typically P type. A first well of a second conductivity type, opposite the first type, is formed in the body. In addition, a second well of the first conductivity type is formed within the first well. A drain region and a source region, both of the second conductivity type, are formed in the second well a surface of the semiconductor body. The drain and source regions are spaced apart so as to define a channel region therebetween in the second well.

A floating gate is disposed over only a first portion of the channel region adjacent the drain region. In addition, a control gate is provided which is electrically insulated from the floating gate. The control gate has a first segment disposed over only a second portion of the channel region adjacent the source region. The control gate further includes a second segment disposed over the floating gate.

In the event the first and second conductivity types are P and N respectively, erasure can be accomplished by applying a negative voltage to the control gate and a positive voltage to the P well which forces any electrons on the floating gate to enter the semiconductor body. In the event of over erasure, the first portion of the channel under the floating gate may become conductive as in a depletion mode transistor. However, the cell will remain non-conductive since the second portion of the channel, displaced from the floating gate, will not be affected by the over erasure.

The erasure voltages also insure that the channel region is at a potential difference, with respect to the floating gate, which is greater than the potential difference of the drain/source regions. Thus, the electrons removed from the floating gate during erase will be attracted to the channel rather than the drain or source. This feature greatly enhances the program/erase cycle endurance of the subject flash cell.

DETAILED DESCRIPTION OF THE INVENTION

Figure 3:
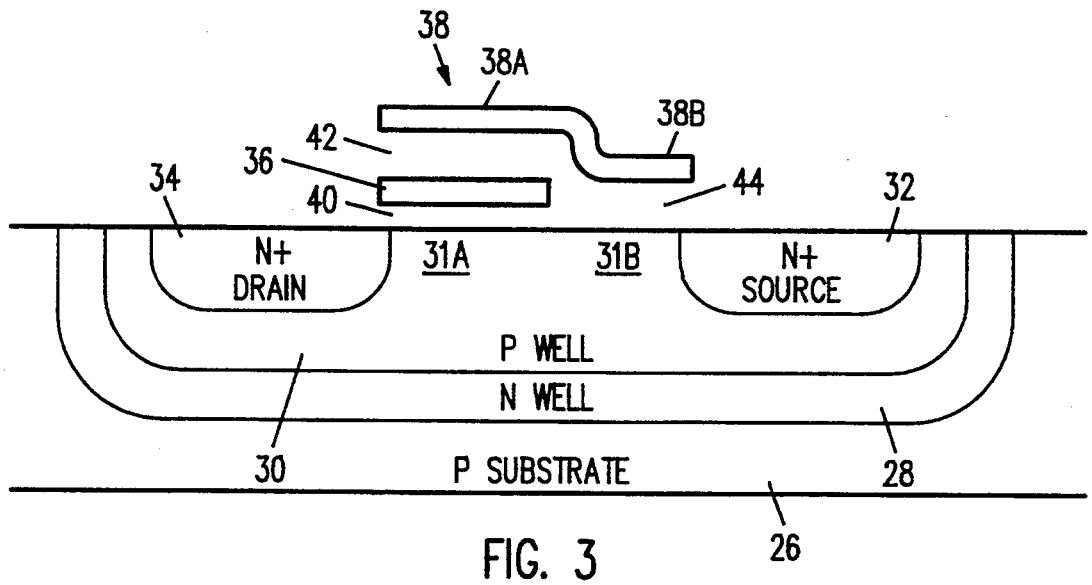
FIG. 3 is a diagram of a flash memory cell in accordance with the present invention.

Referring again to the drawings, FIG. 3 shows a flash memory cell in accordance with the present invention. The cell includes a P type substrate 26, sometimes referred to herein as the semiconductor body, having an N type well 28 formed therein. A P type well 30 is, in turn, formed within the N type well 28.

A drain 34 of N+ conductivity type is formed in well 30. Similarly, a source 32 of N+ conductivity type is formed in well 30, spaced apart from the drain 34. A channel comprised of series arranged channel sections 31A and 31B is disposed between the drain and source regions at the surface of the semiconductor body 26.

A floating gate 36, typically polysilicon, is positioned over channel section 31A and at least part of drain 34. The floating gate 36 is spaced apart from source region 32. A top or control gate 38 is positioned above the channel sections 31A and 31B and the floating gate 36. Top gate segment 38A is disposed above the floating gate 36/channel section 16A and top gate segment 38B is disposed above channel section 38B.

A gate oxide 40 of typically 100 Å thickness is disposed between floating gate 36 and the channel and an interpoly dielectric 42 is disposed between segment 38A and the floating gate 36. In addition, an oxide layer 44 of approximately 250 Å thickness is disposed between the channel and top gate segment 38B.

The process of making the FIG. 3 cell is conventional and forms no part of the present invention.

Programming the FIG. 3 cell is accomplished by grounding the P well 30 together with the N well 28 and the substrate 26. The source region 32 is also grounded. An intermediate voltage (typically +9 volts) is applied to the drain region 34 and a higher voltage (typically +12 volts) is applied to the control gate 38. Electrons originating from the drain 14 are swept into the channel 31A/31B and up through the gate oxide 40 and into the floating gate 36 by way of "hot" electron injection.

The FIG. 3 cell is read by grounding the source 32, P well 30, N well 28 and substrate 26. A relatively low positive voltage (typically +1.5 volts) is applied to the drain 34 and a typical supply voltage Vcc (+5 volts) is applied to the control gate 38. Depending upon the programmed state of the cell, there will or will not be current flow through the cell.

The FIG. 3 cell is erased by grounding the substrate 26 as well as the drain and source regions 34 and 32. The N well 28 and P well 30 are both tied to an intermediate positive voltage (typically +5 volts). Finally, a negative voltage (typically −12 volts) is applied to the top or control gate 38. The N well 28 is thus positive with respect to the P substrate 26 so that the junction remains reversed biased. On the other hand, the +5 volts applied to the N+/P+ junction at the interface of the N well 28 and P well 30, forward biases that junction and a voltage similar to the intermediate voltage appears at the channel 31A/31B.

Figure 1:
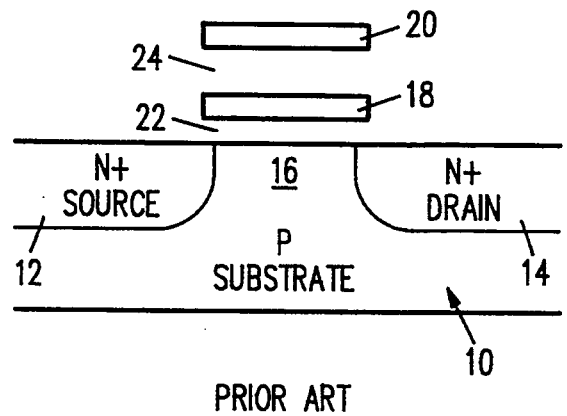
FIG. 1 is a simplified diagram of a conventional semiconductor flash memory cell.
Figure 2:
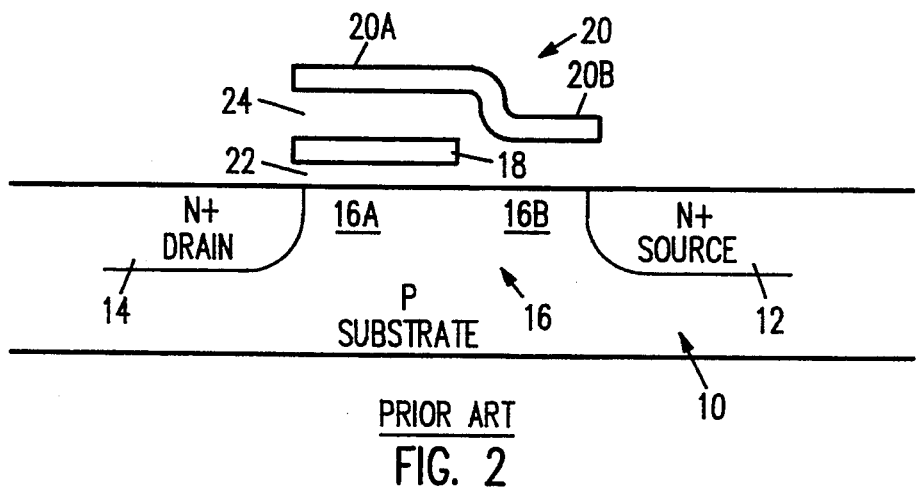
FIG. 2 is a simplified diagram of a conventional flash memory cell having a modified top or control gate.

The intermediate voltage (+5 volts) applied to the P well 30 insures that the channel 31A/31B is more positive than the drain region 34 with respect to the floating gate 36. Thus, the electric field across the gate oxide 30 is greater along the channel region than across the region near the drain 34. This insures that carrier injection will be from the channel and not the drain. Accordingly, the problem of low program/erase cycle endurance noted in connection with the FIG. 2 cell is avoided.

Figure 4:
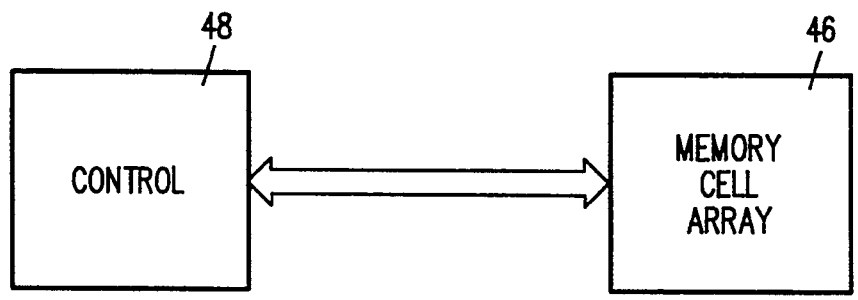
FIG. 4 is a block diagram of a memory cell array and associated controls, including the program/erase circuits.

FIG. 4 is a simplified block diagram of a memory system which includes an array of flash memory cells 46 of the type depicted in FIG. 3. Block 48 represents the control circuitry for interfacing with the memory cell array 46, including address decoders, data latches and circuitry for providing programming, reading and erasure voltages, as previously described in connection with FIG. 3.

Thus, a novel flash memory cell has been disclosed which is immune to problems associated with over erase and which has improved program/erase cycle endurance. Although one embodiment has been described in detail, it is to be understood that changes can be made by those skilled in the art without departing from the spirit and scope of the invention as defined by the appended claims. By way of example, the conductivity types may be reversed together with the polarity of the voltages to provide a complementary type flash memory cell.

I claim:

1. A semiconductor flash memory cell comprising:

a semiconductor body of a first conductivity type;

a first well of a second conductivity type, opposite said first conductivity type, formed in the semiconductor body;

a second well of said first conductivity type formed in the first well;

a first region of the second conductivity type formed in the second well at a surface of the semiconductor body;

a second region of the second conductivity type formed in the second well at said surface and spaced apart from the first region so as to define a channel region between the first region and the second region in the second well, the channel region including a first portion adjacent said first region and a second portion adjacent said second region, with said first and second portions of said channel region defining a series configured electrical path between said first and second regions;

a floating gate disposed over only said first portion of the channel region; and a control gate electrically insulated from the floating gate and having a first segment disposed over only said second portion of the channel region and a second segment disposed over the floating gate.

2. The memory cell of claim 1 wherein the first conductivity type is P type and the second conductivity type is N type and wherein said first region forms a drain region of said cell and said second region forms a source region of said cell.

3. The memory cell of claim 2 further including control means for providing programming, erase and read voltages to the cell, where the erase voltages include voltages which insure that the channel region is more positive than the drain region relative to the voltage of the floating gate.

4. The memory cell of claim 3 wherein the erase voltages include a common voltage which is applied to the semiconductor body, a positive voltage, relative to the common voltage, which is applied to both the first and second wells and a negative voltage, relative to the common voltage, which is applied to the control gate.

5. The memory cell of claim 4 wherein the erase voltages include said common voltage applied to the drain and source regions.

* * * * *